(12) United States Patent
Hellberg

(10) Patent No.: US 8,653,886 B2
(45) Date of Patent: Feb. 18, 2014

(54) METHOD AND ARRANGEMENT IN A MOBILE COMMUNICATIONS SYSTEM

(75) Inventor: Richard Hellberg, Huddinge (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 58 days.

(21) Appl. No.: 13/388,415

(22) PCT Filed: Sep. 15, 2009

(86) PCT No.: PCT/SE2009/051021
§ 371 (c)(1),
(2), (4) Date: Feb. 1, 2012

(87) PCT Pub. No.: WO2011/034473
PCT Pub. Date: Mar. 24, 2011

(65) Prior Publication Data
US 2012/0139628 A1    Jun. 7, 2012

(51) Int. Cl.
*H03F 1/14* (2006.01)
(52) U.S. Cl.
USPC ............. 330/51; 330/136; 330/297; 330/295; 330/124 R
(58) Field of Classification Search
USPC ................... 330/51, 136, 124 R, 295
See application file for complete search history.

(56) References Cited

U.S. PATENT DOCUMENTS

| | | | |
|---|---|---|---|
| 6,137,355 A | 10/2000 | Sevic et al. | |
| 6,255,906 B1 | 7/2001 | Eidson et al. | |
| 2002/0097087 A1* | 7/2002 | Petz et al. | 330/124 R |
| 2002/0136325 A1 | 9/2002 | Pehlke et al. | |
| 2005/0030094 A1 | 2/2005 | Conrad et al. | |

OTHER PUBLICATIONS

International Search Report, PCT Application No. PCT/SE2009/051021, May 26, 2010.
Written Opinion of the International Searching Authority, PCT Application No. PCT/SE2009/051021, May 26, 2010.
International Preliminary Report on Patentability, PCT Application No. PCT/SE2009/051021, Nov. 24, 2011.
Kahn; "Single-Sideband Transmission by Envelope Elimination and Restoration" Proceedings of the I.R.E.; vol. 40, No. 7; pp. 803-806, Jul. 1952.
Loy Barton; "A Plate Modulation Transformer for Broadcasting Stations" Bulletin No. 8; Engineering Experiment Station; Fayetteville, Arkansas; University of Arkansas Library, vol. 23, No. 21; pp. 1-22, May 1930. http://www.amwindow.org/tech/htm/barton/1.htm.

\* cited by examiner

*Primary Examiner* — Robert Pascal
*Assistant Examiner* — Khiem Nguyen
(74) *Attorney, Agent, or Firm* — Myers Bigel Sibley & Sajovec, P.A.

(57) ABSTRACT

The invention is based on the fact that the current output from a DDB controlled amplifier in backoff, i.e. for low amplitudes, is reduced more or less linearly with the amplitude of the signal to be amplified. Therefore, it is enough to use smaller amplifiers which are able to output the necessary RF current. Hence, according to the present invention, the total DDB amplifier is divided into smaller parts that are coupled to the output only when needed.

8 Claims, 11 Drawing Sheets

METHOD AND ARRANGEMENT IN A MOBILE COMMUNICATIONS SYSTEM

CROSS REFERENCE TO RELATED APPLICATIONS

This application is a 35 U.S.C. §371 national stage application of PCT International Application No. PCT/SE2009/051021, filed on 15 Sep. 2009, the disclosure and content of which is incorporated by reference herein in its entirety. The above-referenced PCT International Application was published in the English language as International Publication No. WO 2011/034473 A1 on 24 Mar. 2011.

TECHNICAL FIELD

The present invention relates to method and arrangement in a mobile communications system and in particular to a DDB amplifier with increased efficiency.

BACKGROUND

Transmitters in base stations and terminals for mobile telephony as well as transmitters for broadcast and other wireless systems all need power amplifiers (PA) to amplify the radio frequency (RF) signal to the antenna. Often, this PA needs to be very efficient to increase battery time, decrease the energy cost, and minimize cooling needs.

Traditional class B and AB PAs usually operate with constant load and constant supply voltage. The "optimal load" (Ropt) is the load that gives the highest output power under allowed operating conditions. Class B or AB operation means that the transistor current pulses approximately have the shape of half-wave rectified sine waves. The current pulses have largely the same shape at all amplitudes, and both the RF output current and the DC supply current, and hence DC power, are therefore approximately proportional to their height. This is also the case with the RF output voltage. The RF output power is proportional to the RF output current squared, which means that the DC to RF efficiency is approximately proportional to the RF output voltage amplitude. Due to this proportionality, the average efficiency for a class B amplifier outputting a signal whose average signal level is well below the maximum (peak) level is low compared to the efficiency at maximum output.

Dynamic Drain Bias (DDB) amplifiers increase the efficiency by reducing supply voltage according to the RF voltage needs of the amplifier. It uses a continuous RF-voltage-envelope-following supply voltage that minimizes the average voltage drop across the transistor. Dynamic drain biasing is the collective name for all similar techniques: Envelope Elimination and Restoration (EER), Envelope Tracking (ET), Drain (Bias) Modulation, Collector Modulation, Plate Modulation. Amplification of the envelope into a dynamic supply voltage is done in an efficient, switch mode or switch mode assisted, baseband amplifier. A DDB controlled amplifier is illustrated in FIG. 1.

The input signal (in baseband, IF, or RF form) 108 is fed to a drive/control signal processing block 100. This block outputs a drive signal to the RF amplifier 106 via an up converter 102, and a Vdd 112 (supply) voltage control signal to a switched mode power supply (SMPS) 104. The SMPS outputs one varying supply voltage that is fed to the amplifier 106.

Dynamic Drain Bias amplifiers are essentially neutral to series or shunt loss. Both these types of loss degrade efficiency equally at all output power levels. DDB controlled amplifiers are instead extra sensitive to residual voltage drop across the transistor at low output levels, an effect that is present for example in bipolar transistors. The efficiency curve of a DDB controlled amplifier with all three types of loss is shown in FIG. 2.

SUMMARY

Thus, an objective of the present invention is to provide an amplifier that has high efficiency and is less sensitive to shunt loss than prior art amplifiers.

The invention is based on the fact that the current output from a DDB controlled amplifier in backoff, i.e. for low amplitudes, is reduced more or less linearly with the amplitude of the signal to be amplified. Therefore, it is enough to use smaller amplifiers which are able to output the necessary RF current.

Hence, according to the present invention, the total amplifier is divided into smaller parts that are coupled to the output only when needed. The series resistive loss is generally increased by this procedure, so in amplifiers whose transistors have both series and shunt loss only segment combinations above a certain size will be needed.

The efficiency is increased most at medium and low amplitudes. This fits the amplitude density distribution of most multicarrier/multiuser signals, for example CDMA, FDMA and OFDM.

According to a first aspect of the present invention a method for amplifying a signal with varying amplitude with dynamic drain bias (DDB) controlled amplifier means is provided. In the method, an amplitude of the signal to be amplified is determined and a combination of amplifier segments of the DDB controlled amplifier means to be used for amplifying the signal based on the determined amplitude is selected. In a further step, a respective bias level to be used for controlling the DDB amplifier segments is selected based on the amplitude and the amplifier segments of the selected combination are connected. The signal is amplified with the selected combination of amplifier segments and the respective bias level for the respective amplifier segments is being used.

According to a second aspect of the present invention a device for amplifying a signal with varying amplitude is provided. The device comprises a plurality of dynamic drain bias (DDB) power amplifier segments adapted to be connected with each other for providing a variable amplification. The device further comprises a unit for determining an amplitude of the signal to be amplified, for selecting a combination of amplifier segments of the DDB controlled amplifier means to be used for amplifying the signal based on the determined amplitude, and for selecting a respective bias level to be used for controlling the DDB amplifier segments based on the determined amplitude. The device also comprises connectors for connecting the amplifier segments of the selected combination.

An advantage is that the embodiments of the present invention have the potential for very high efficiency, especially for peaky signals (high peak to average ratio) and in backoff (i.e. at high amplitudes). In many cases the embodiments of the invention reduces the impact of shunt loss greatly compared to the underlying techniques.

BRIEF DESCRIPTION OF THE DRAWINGS

FIG. 5 illustrates the embodiment with RF switches and FIGS. 6 and 7 illustrate the embodiment based on tuneable capacitors.

DETAILED DESCRIPTION

Figure 1:
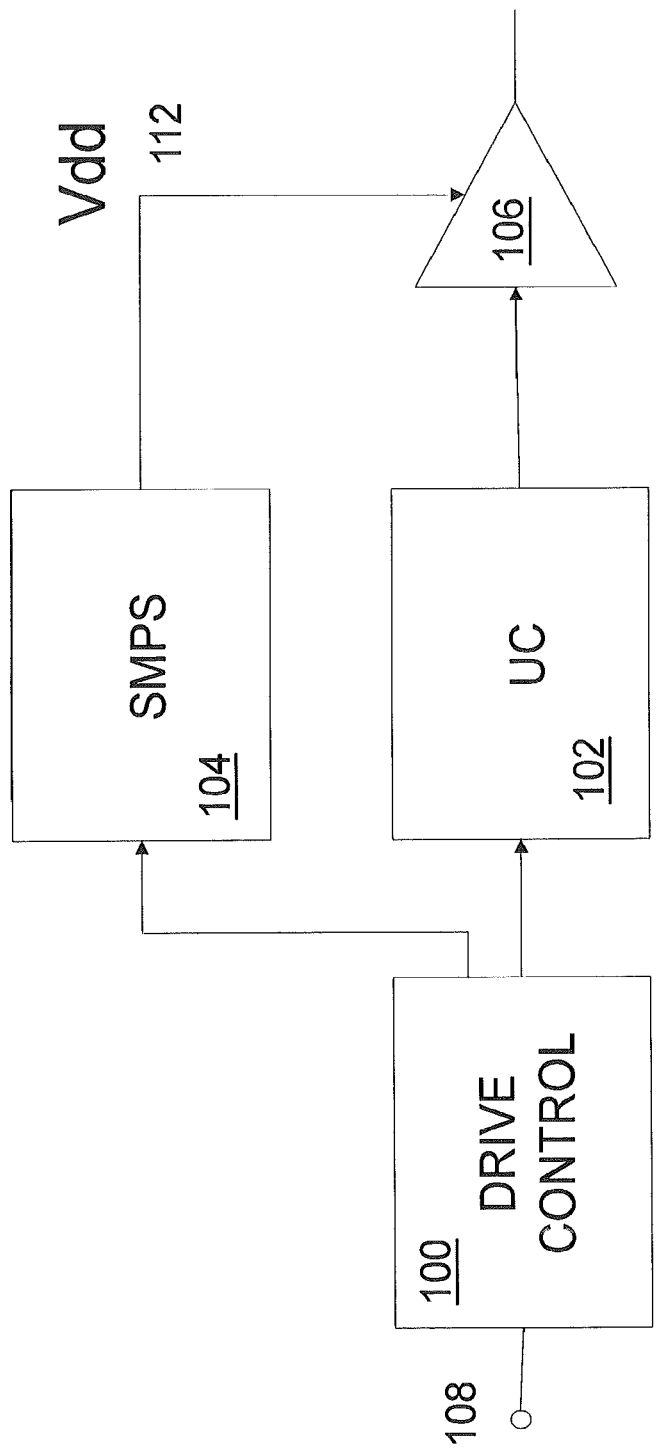
FIG. 1 illustrates a DDB controlled amplifier according to prior art.
Figure 2:
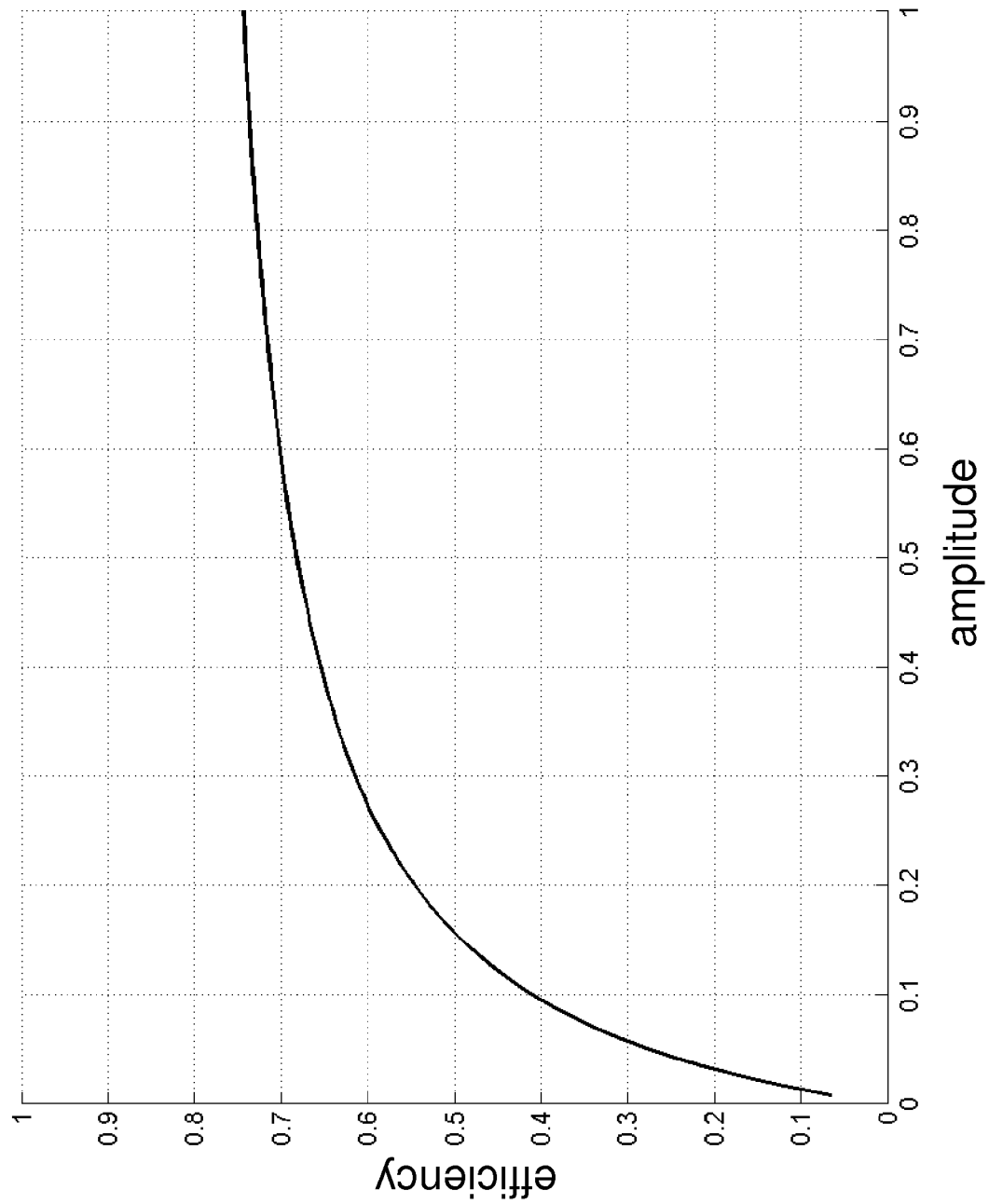
FIG. 2 shows an efficiency curve of a DDB controlled amplifier with all three types of loss.

The present invention will be described more fully hereinafter with reference to the accompanying drawings, in which preferred embodiments of the invention are shown. The invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like reference signs refer to like elements.

Moreover, those skilled in the art will appreciate that the means and functions explained herein below may be implemented using software functioning in conjunction with a programmed microprocessor or general purpose computer, and/or using an application specific integrated circuit (ASIC). It will also be appreciated that while the current invention is primarily described in the form of methods and devices, the invention may also be embodied in a computer program product as well as a system comprising a computer processor and a memory coupled to the processor, wherein the memory is encoded with one or more programs that may perform the functions disclosed herein.

Figure 3:
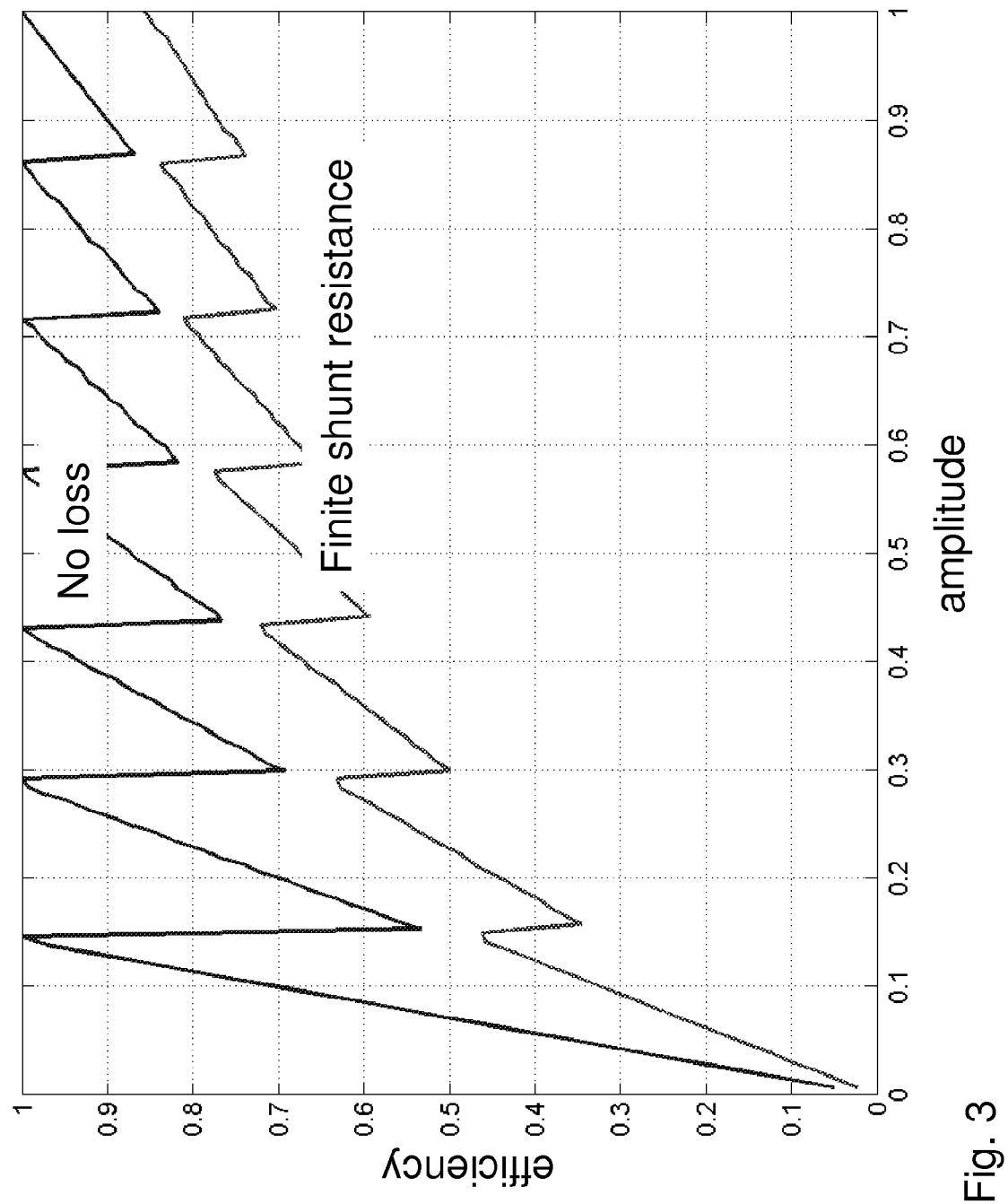
FIG. 3 illustrates the efficiency for a segmented amplifier with quarter-wave lines with and without shunt loss.

Real transistors often have substantial parasitic losses that reduce the achievable efficiency. However, segmentation of the amplifier into several smaller amplifiers that are individually coupled by quarter-wave transmission lines to the output increases efficiency. Efficiency maxima at several low amplitudes are obtained. This is because the quarter-wave lines, which have characteristic impedance of Ropt of the transistor they are connected to, transform the load resistance into a higher resistance than Ropt at the transistor outputs. This type of amplifier then has a lower average sum of RF output currents from the transistors than a conventional amplifier. The RF voltages at the active transistors' outputs are at the same time increased. The switching in and out of amplifier segments can be done either by switches or tuneable circuits. However, segmented amplifier reduces the average output current. This reduces loss that can be seen as effectively in series (with the load) at the transistors' output nodes. Another type of loss mechanism can be seen as effectively in shunt (coupled from node to ground) at the output node. This loss gets worse in segmented amplifiers with quarter-wave lines since they depend upon high RF voltages at the transistors. The efficiency for a segmented amplifier with quarter-wave lines from each amplifier segment to the load, for no shunt loss (upper trace) and loss due to a shunt resistor (lower trace) is shown in FIG. 3. Three binary weighted segments are used in FIG. 3.

Accordingly, the present invention is based on the fact that the current output from a DDB controlled amplifier in back-off, i.e. for low amplitudes, is reduced more or less linearly with amplitude. Therefore, it will be enough to use smaller amplifiers which are able to output the necessary RF current. Therefore, according to the present invention, the total amplifier is divided into smaller parts, referred to as amplifier segments, which are coupled to the output only when needed. The series resistive loss is generally increased by this procedure, so in amplifiers whose transistors have both series and shunt loss only segment combinations above a certain size will be needed.

Figure 4:
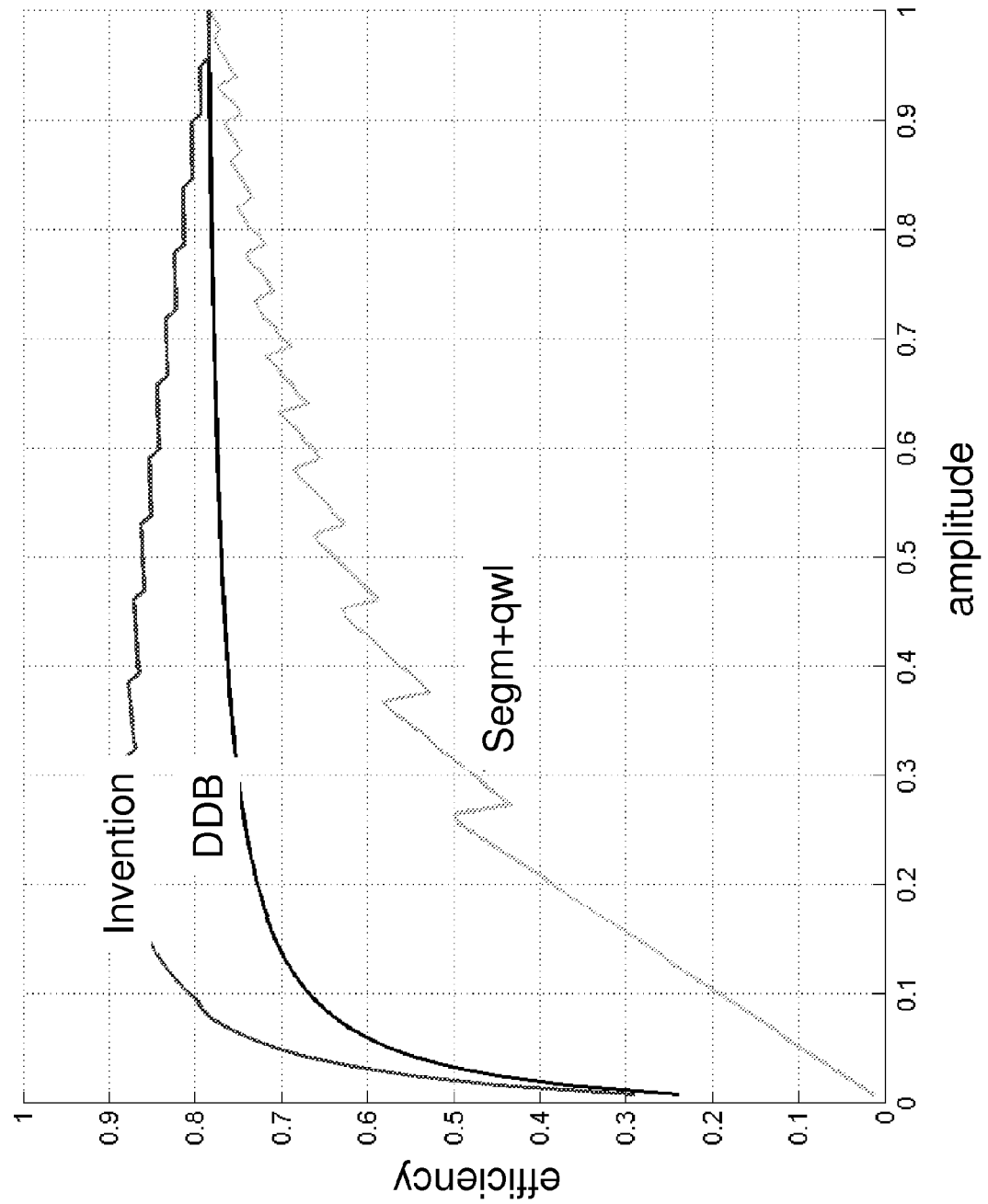
FIG. 4 is an example of the resulting efficiency increase when an embodiment of the present invention is used.

An example of the resulting efficiency increase obtained by the present invention is shown in FIG. 4. In FIG. 4, the efficiency curve of the present invention is compared with the efficiency curves of prior art methods.

Figure 5:
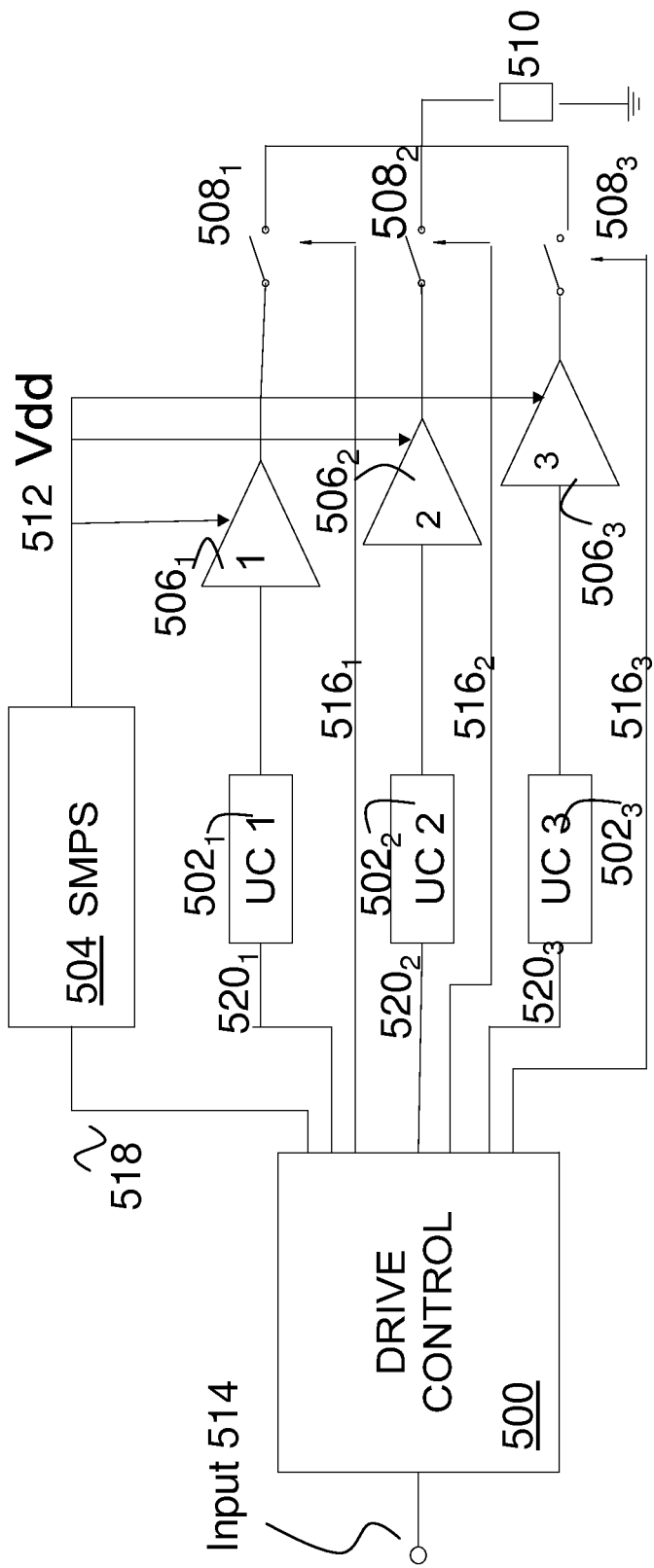
FIGS. 5-7 illustrate different embodiments of the present invention.

A first embodiment with RF switches is schematically shown in FIG. 5. The coupling of amplifiers or transistors to the load is here done with connectors comprising (RF) switches (SPST) 508. The input signal (in baseband, IF, or RF form) 514 is fed to a drive/control signal processing unit 500. This unit 500 outputs drive signals $520_1$, $520_2$, $520_3$ to the RF amplifier segments $506_1$, $506_2$, $506_3$ control signals $516_1$, $516_2$, $516_3$ to the RF switches $508_1$, $508_2$, $508_3$, and a Vdd (supply) voltage control signal 518 to a switched mode power supply (SMPS) 504. Thus the unit 500 determines an amplitude of the input signal 514 and selects a combination of amplifier segments to be used for amplifying the input signal based on the determined amplitude. In addition, the unit 500 selects a respective bias level 512 to be used for controlling the DDB amplifier segments. In its simplest (but sufficient) form the SMPS outputs one varying supply voltage (bias level) 512 that is fed to all amplifier segments. The RF switches connect the amplifier segments to the common output at $R_L$ (ally in parallel). $R_L$ 510 is the load resistance, usually the transformed impedance of an antenna or a cable. Moreover, the unit 500 may also be configured to select a plurality of amplitude ranges for the amplitude of the signals to be amplified and one combination of amplifier segments is performed for each amplitude range.

Figure 6:
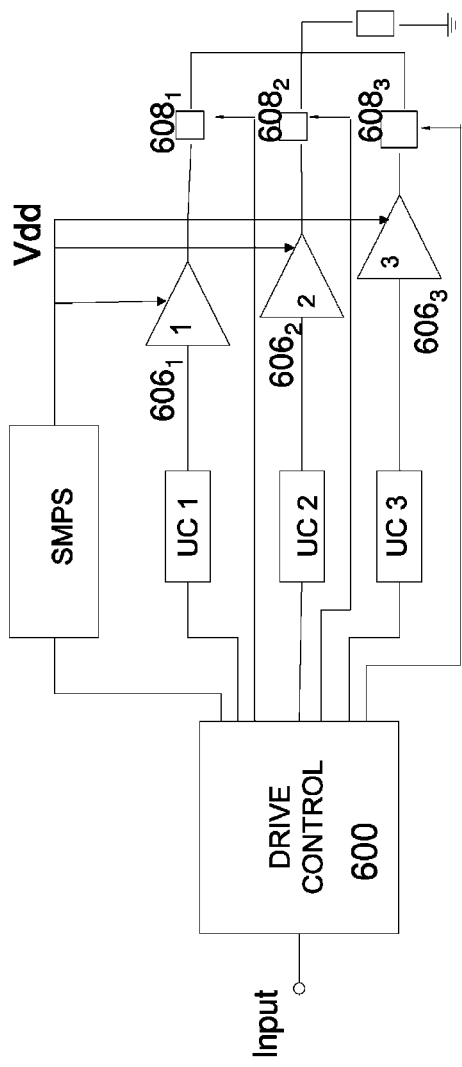
Figure 7:
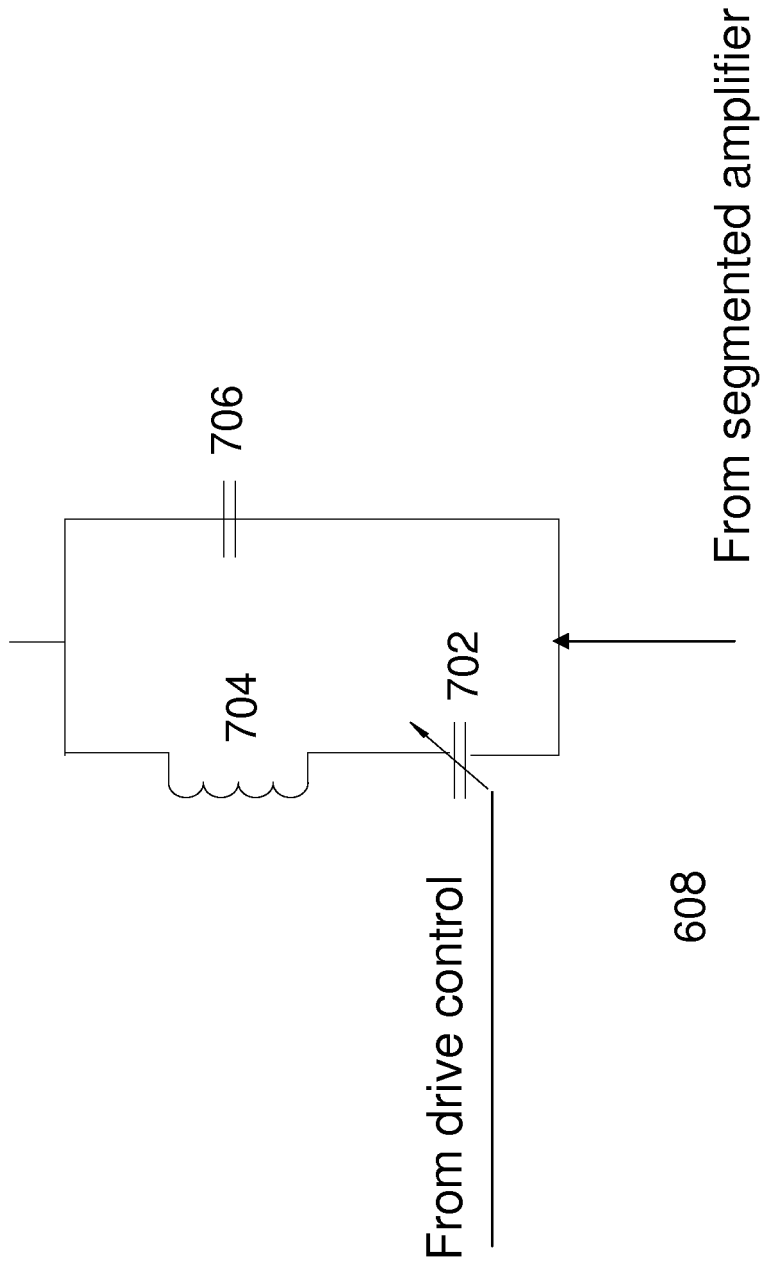

Another embodiment uses tuneable components in a resonant network, as shown in FIGS. 6 and 7. FIG. 6 shows a corresponding arrangement as FIG. 5 except that the connectors $608_1$, $608_2$, $608_3$ comprise dynamically tuned capacitors instead of RF switches $508_1$, $508_2$, $508_3$. For each amplifier segment $606_1$, $606_2$, $606_3$, a dynamically tuned variable capacitor 702 is used in a network that provides a series resonance or a parallel resonance depending on the tuning. At one tuning, the variable capacitor 702 together with an inductor 704 creates a series resonance in order to couple one of the amplifier segments to the load as shown in FIG. 7. Isolation from the load is achieved by providing a reactance 706 in parallel with the series circuit, which makes the circuit parallel resonant when the variable capacitor is used with another tuning.

Figure 8:
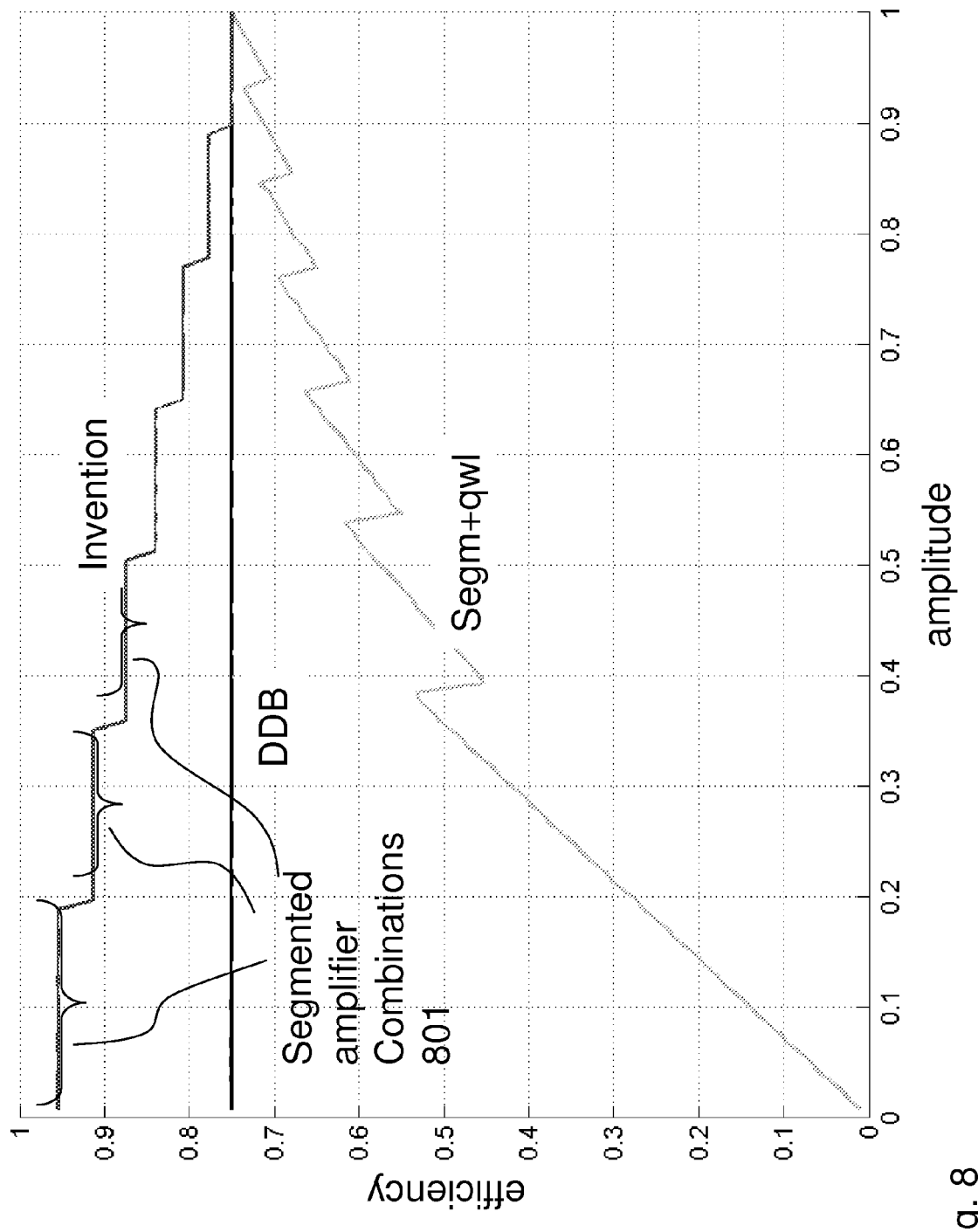
FIG. 8 shows the efficiency curve for transistors with only shunt parasitics at RF.

The efficiency of the invention is increased most compared to prior art when shunt losses at RF are big. The efficiency curve for a transistor technology with only shunt parasitic loss is shown in FIG. 8.

Figure 9:
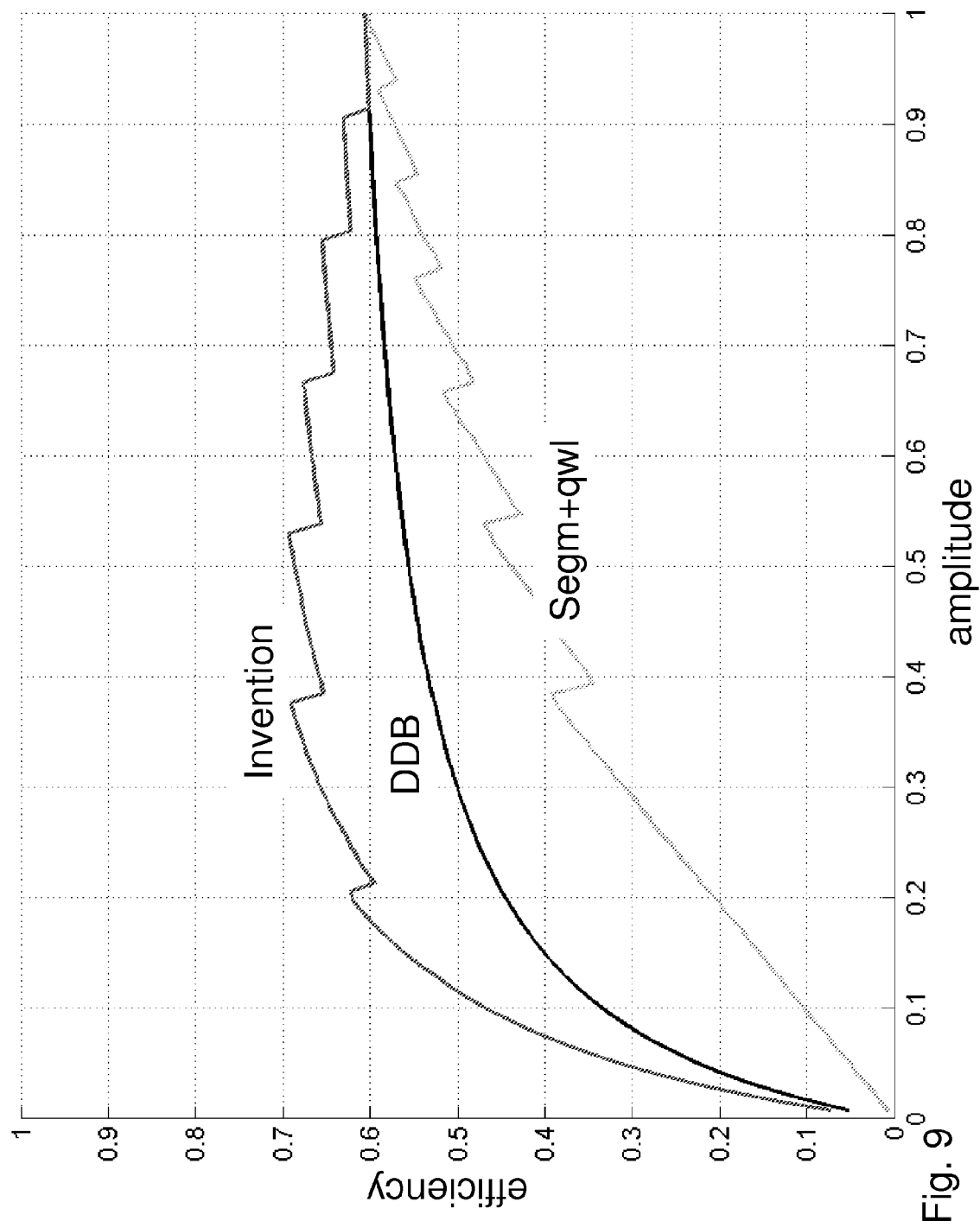
FIG. 9 shows the efficiency for transistors with $Vce_{sat}$ and RF shunt loss.

Dynamic drain biasing systems are generally most affected by residual voltage drop across the transistor, in bipolar transistors called $Vce_{sat}$. The invention is still effective for such transistors, as shown in FIG. 9.

Figure 10:
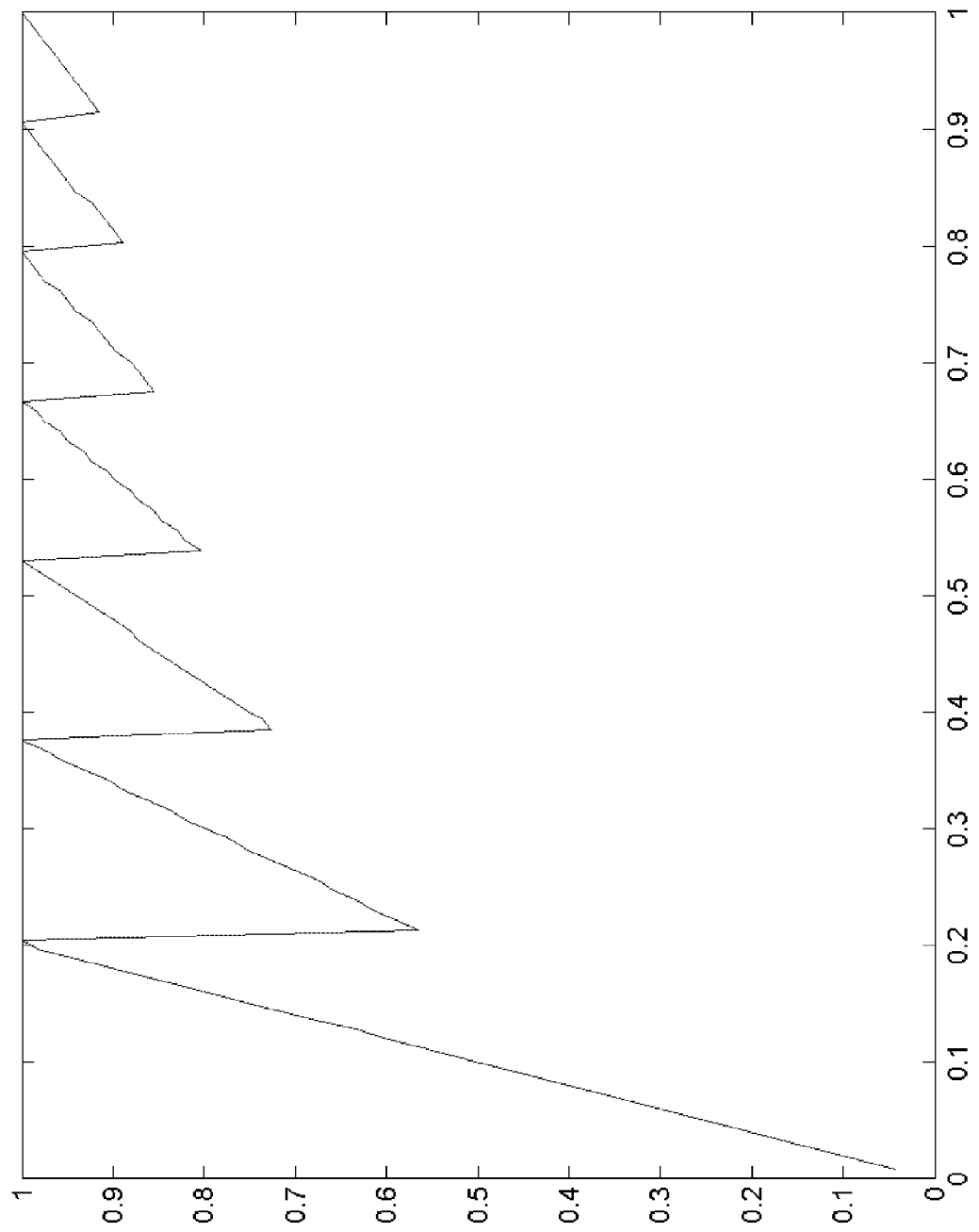
FIG. 10 shows the output RF current vs. output amplitude normalized to the maximum output of the segment combinations.

The RF output current relative to the maximum possible output from each combination of segments is shown in FIG. 10.

The output RF current for each combination of segments is in this example used to the maximum before a new combination sets in (for increasing amplitude). This is also reflected in the RF drive voltage at the input side of the amplifier segments (transistors). (The RF drive signal amplitudes to the different amplifier segments will depend on many factors such as the transistors' transconductance curves and the chosen (gate, base) bias levels).

Depending on the envelope bandwidth of the signals and the performance of tunable or switch components, it may be hard or inefficient to provide supply voltage, switch or tune the output connections at envelope speeds. The invention can then be used with slower supply voltage variations, tuning or switching provided some headroom is provided for fast power bursts. This possibility exists all the way down to quasi-static mode.

Figure 11:
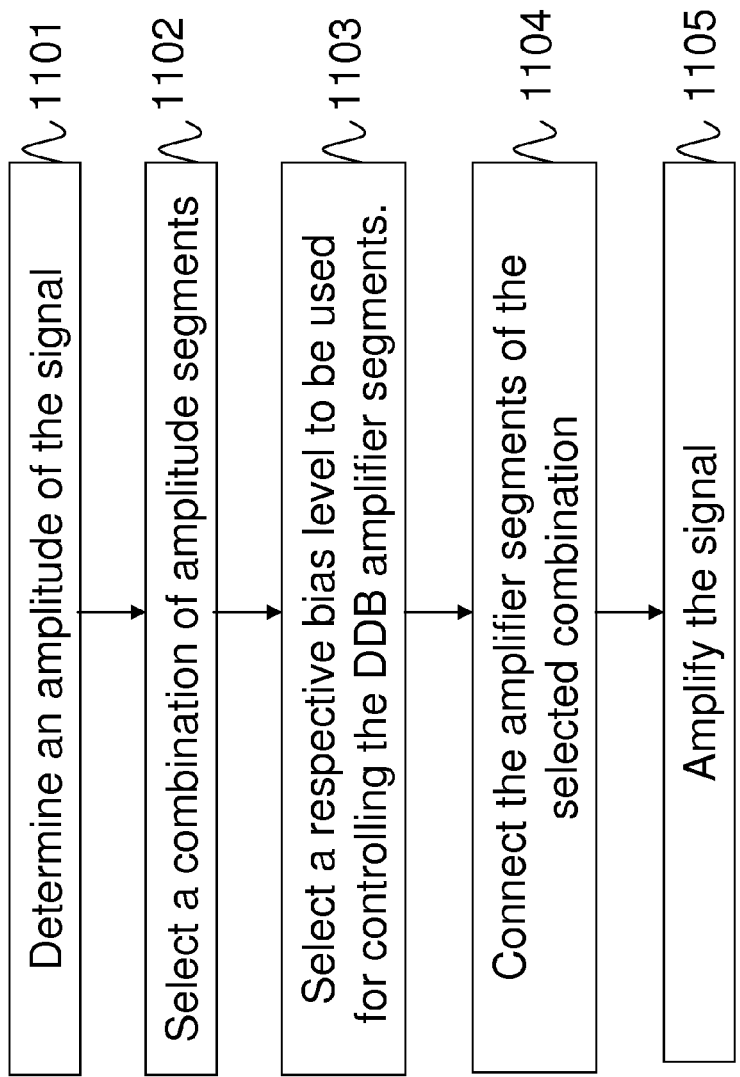
FIG. 11 is a flowchart of the method according to embodiments of the present invention.

Turning now to FIG. 11 which illustrates a flowchart of the method according to embodiments of the present invention. The method comprises the steps of:

1101. Determine an envelope amplitude of the signal to be amplified.

1102. Select a combination of amplifier segments of the DDB controlled amplifier means to be used for amplifying the signal based on the determined amplitude by transferring a control signal from the drive control unit to the respective connectors such as the selected combination of amplifier segments are connected. If a plurality of amplitude ranges for the amplitude is selected, the combination of amplifier segments may be performed for each amplitude range.

1103. Select a respective bias level to be used for controlling the DDB amplifier segments.

1104. Connect the amplifier segments of the selected combination.

1105. Amplify the signal with the selected combination of amplifier segments and using the respective bias level for the respective amplifier segments.

The present invention is not limited to the above-described preferred embodiments. Various alternatives, modifications and equivalents may be used. Therefore, the above embodiments should not be taken as limiting the scope of the invention, which is defined by the appending claims.

The invention claimed is:

1. A method for amplifying a signal with varying amplitude using a dynamic drain bias, DDB, controlled amplifier, the method comprising the steps of:
   determining an amplitude of the signal to be amplified;
   selecting a combination of a plurality of amplifier segments of the DDB controlled amplifier to be used for amplifying the signal based on the determined amplitude;
   selecting a respective bias level to be used for controlling each of the selected combination of the amplifier segments based on the determined amplitude;
   connecting the selected combination of the amplifier segments; and
   amplifying the signal with the selected combination of the amplifier segments and using the respective bias level for the respective amplifier segments,
   wherein the connecting step is performed by tuning tuneable components in a resonant network coupled to the DDB controlled amplifier.

2. The method according to claim 1, wherein the connecting step is performed by connecting an RF switch coupled to the DDB controlled amplifier.

3. The method according to claim 1, wherein each of the tuneable components comprise a variable capacitor.

4. The method according to claim 1, wherein each of the tuneable components comprise a circuit having a variable capacitor connected in series with an inductor.

5. A device for amplifying a signal with a varying amplitude, the device comprising:
   a dynamic drain bias, DDB, controlled amplifier comprising a plurality of power amplifier segments adapted to be connected with each other for providing a variable amplification;
   a unit configured for:
      determining an amplitude of the signal to be amplified;
      selecting a combination of the power amplifier segments of the DDB controlled amplifier to be used for amplifying the signal based on the determined amplitude; and
      selecting a respective bias level to be used for controlling each of the selected combination of the amplifier segments based on the determined amplitude; and
   connectors for connecting the selected combination of the amplifier segments for amplifying the signal,
   wherein each connector comprises tuneable components in a resonant network coupled to the DDB controlled amplifier.

6. The device according to claim 5, wherein each connector comprises an RF switch coupled to the DDB controlled amplifier.

7. The device according to claim 5, wherein each of the tuneable components comprise variable capacitors.

8. The device according to claim 5, wherein each of the tuneable components comprise a circuit having a variable capacitor connected in series with an inductor.

* * * * *